United States Patent [19]
Chiu et al.

[11] Patent Number: 5,934,936
[45] Date of Patent: Aug. 10, 1999

[54] CONNECTOR HAVING ADJUSTABLE SOLDER TAB

[75] Inventors: Allen Chiu, Taipei; Jia-Hung Liu, Hsin-Chuang; Jerry Wu, Chang-Hua Hsien, all of Taiwan

[73] Assignee: Hon Hai Precision Ind. Co., Ltd., Taipei Hsien, Taiwan

[21] Appl. No.: 09/104,842

[22] Filed: Jun. 25, 1998

[51] Int. Cl.$^6$ .................................................. H01R 13/73
[52] U.S. Cl. ............................................................ 439/570
[58] Field of Search .................................... 439/570, 571, 439/572, 83

[56] References Cited

U.S. PATENT DOCUMENTS 5,096,440  3/1992  Katsumata .............................. 439/570

Primary Examiner—Gary Paumen

[57] ABSTRACT

A connector equipped with auxiliary solder tabs which are self-adjustable as to height for ensuring coplanarity between solder terminals of the connector and the auxiliary solder tabs. The self-adjustability of the tabs ensures that the tabs will always properly contact a circuit board to which the connector is to be connected, independent of the plane defined by the solder terminal. The connector has at least one extension wall and various embodiments are proposed to achieve a pivotable relationship between the solder tab and the extension wall(s).

20 Claims, 13 Drawing Sheets

CONNECTOR HAVING ADJUSTABLE SOLDER TAB

BACKGROUND OF THE INVENTION

The present invention generally relates to a surface mount type connector equipped with solder tabs, and more particularly to a surface mount connector equipped with solder tabs which can self-adjust to ensure planarity between the solder tabs and solder terminals whereby both the tabs and the terminals can be properly soldered to a mother board.

A surface mount connector for a memory module, e.g. a small outline memory module (SO DIMM), must be equipped with auxiliary solder tabs. In this arrangement, an upward lifting force applied to the connector by manipulating the memory module to insert it into or extract it out of a connector tends to dismount the solder terminals from the circuit board. The negative effects of the force can be lessened by the provision of the auxiliary solder tabs which reduce the strain on the solder terminals.

A known type of connector is shown in FIG. 13. A plurality of solder terminals 100 arranged in two rows extend outward from an insulative housing to be soldered to a circuit board and a pair of solder tabs 200 are provided near respective free ends of both legs 300 of the connector. The two rows of solder terminals 100 together define a common plane on which all the solder terminals lie. The solder tabs 200 extend perpendicular to a lengthwise direction of the leg 300. The solder tabs 200 assist in securely mounting the connector to the circuit board, otherwise, a memory module (not shown) inserted into a slot formed in a body 400 of the insulative housing will be subject to an upward force tending to dismount the solder terminals from the circuit board. One type of solder tab can be seen in U.S. Pat. No. 5,759,057 which is assigned to the same assignee of the present application. The solder tab disclosed therein basically forms part of a one-piece metal member securely connected to a latching device and is therefore stationary with respect to the solder terminals of the connector.

While it is advantageous to use solder tabs, difficulties are experienced in maintaining the planarity between the solder terminals and the solder tabs. Where planarity is not established between the solder terminals and the solder tabs, either the solder tabs will not be properly solder mounted to a circuit board, thus diminishing the intended purpose of the solder tabs, or the solder terminals will not be properly solder mounted to the circuit board.

The present invention thus aims to ensure that the solder tabs achieve the intended auxiliary function while not adversely affecting or interfering with the soldering of the solder terminals to a motherboard.

BRIEF SUMMARY OF THE INVENTION

One object of the present invention is to provide a connector to be surface mounted to a circuit board, having self-adjusting solder tabs so that a subsequent soldering operation can be properly performed.

According to a feature of the invention, the connector comprises an insulative body having a pair of legs; a plurality of electrical contacts received in the insulative body, each electrical contact having a solder terminal lying in a common plane; and a pair of solder tabs each pivotally connected with a corresponding leg, each solder tab having an end edge adjustably pivotable to substantially lie in the common plane.

The leg may comprise a single or a pair of extension wall(s) and a pivot or a pair of protrusions on the extension wall(s), and the solder tab may be suitably adapted to be pivotable with respect to the leg.

According to another feature of the invention, the connector comprises a pair of solder tabs each pivotally connected with a corresponding leg in such a manner that an end edge of the solder tab contacts a circuit board independent of a common plane on which the solder terminals of the connector lie.

Preferably, an end portion of the solder tab containing the end edge is curved to facilitate a reliable soldering operation.

Preferably, an end portion of each solder tab opposite the end edge comprises a stop and the leg comprises a wall face adjacent to the stop for limiting the pivotal movement of the solder tab relative to the leg.

Other objects, advantages and novel features of the invention will become more apparent from the following detailed description when taken in conjunction with the accompanying drawings.

DETAILED DESCRIPTION OF THE INVENTION

In the several drawing figures, although only a part of a connector is shown, it is to be understood that this part of the connector may be either an integral part of one of the two legs of a connector or a separate block which then is attached to one leg in a suitable way, e.g. by welding, gluing or any other known method of fastening. In the case of a separate block, any suitable known means may be provided on both the block and the leg so that both components can be connected together. Also, for the sake of simplicity, only one leg of a connector and the associated solder tab are shown and will be described and, as can be clearly understood, the other leg and associated solder tab may be a mirror image or obvious variation thereof.

Figure 1:
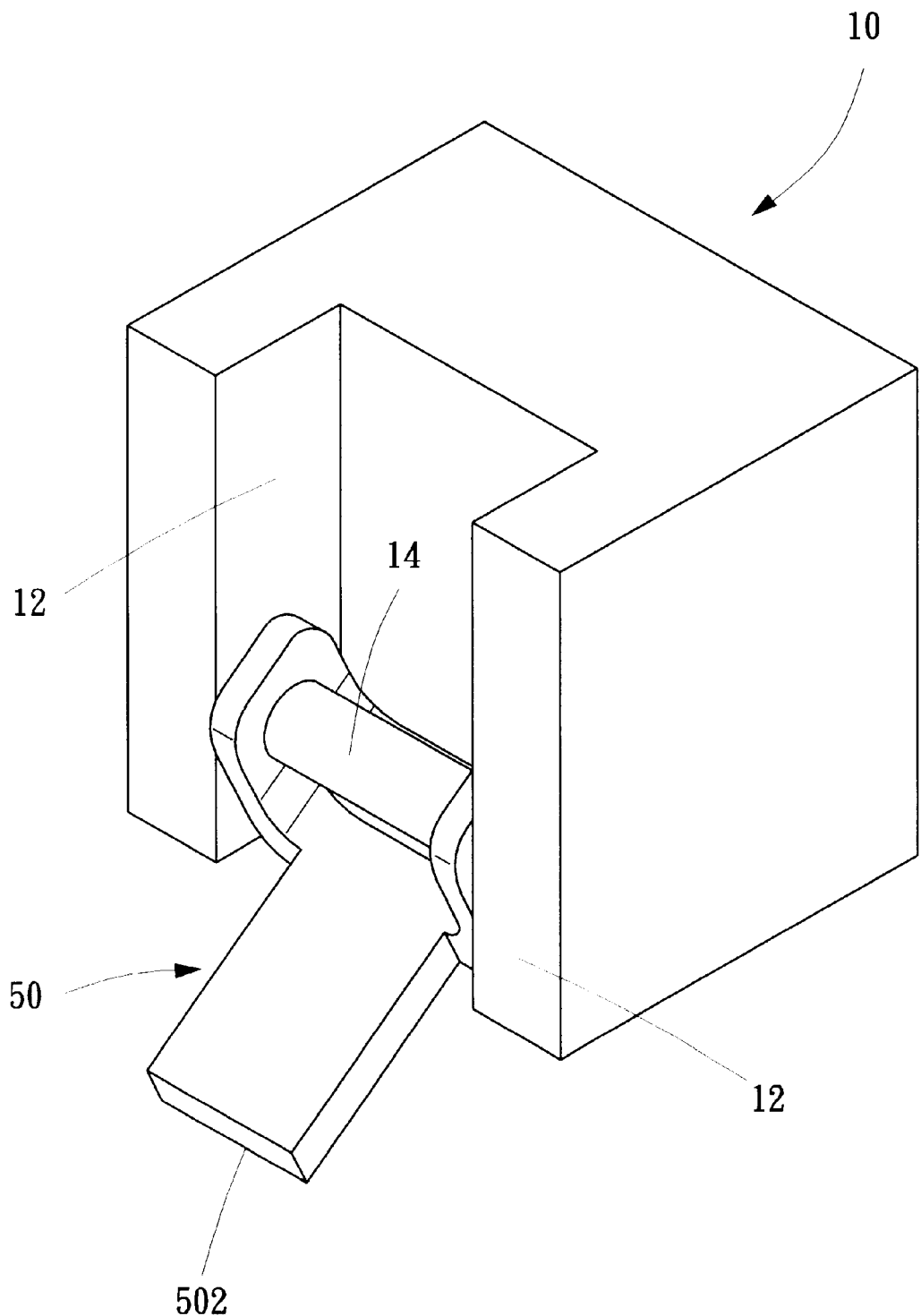
FIG. 1 is a schematic perspective view showing a part of a connector which incorporates a solder tab in accordance with one embodiment of the present invention.
Figure 2:
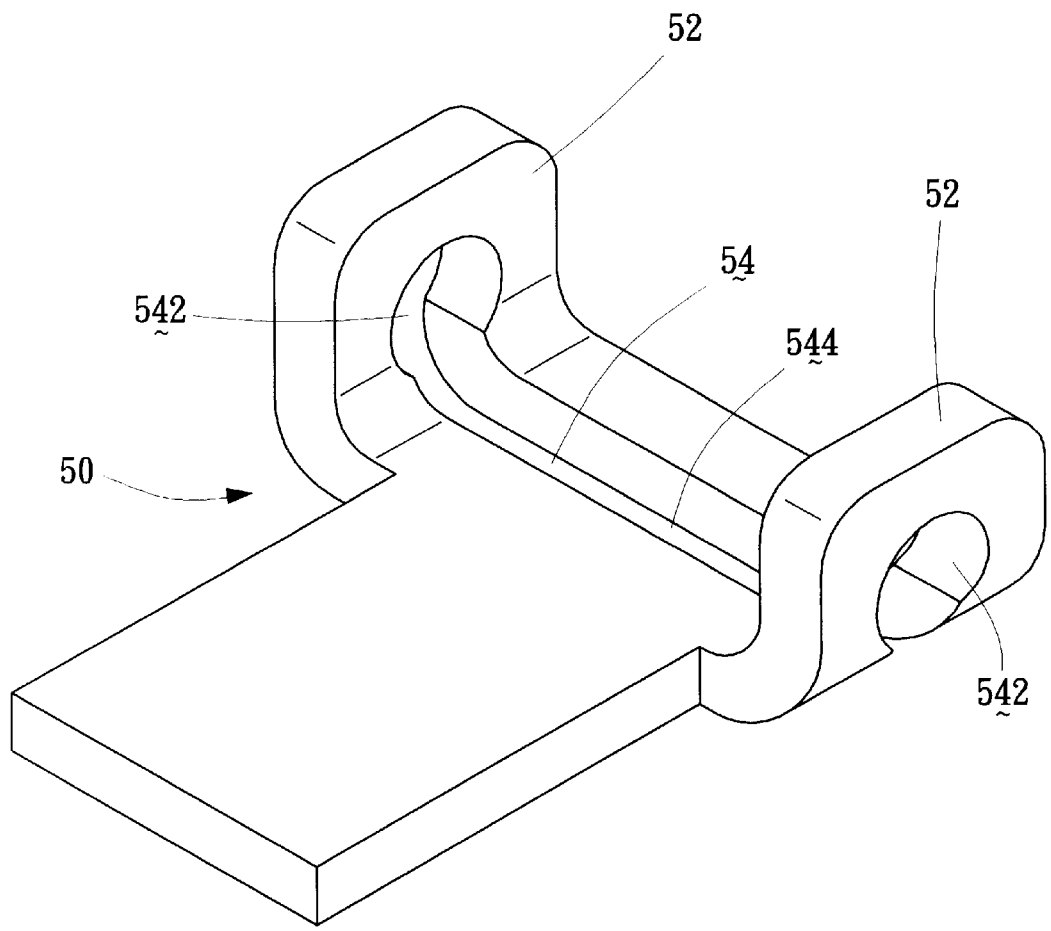
FIG. 2 is a perspective view of the solder tab shown in FIG. 1.
Figure 3:
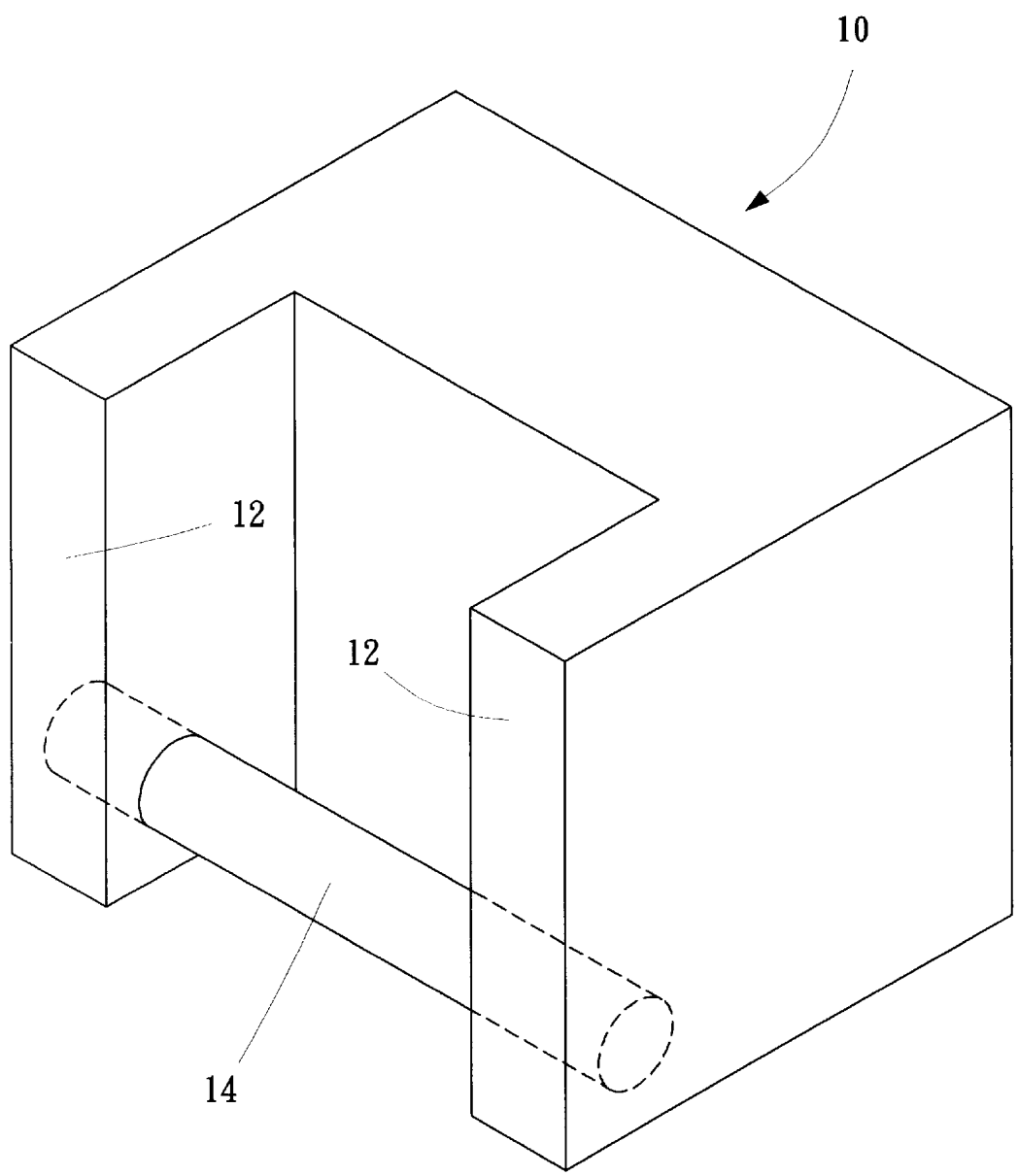
FIG. 3 is a perspective view of the part of the connector shown in FIG. 1.
Figure 13:
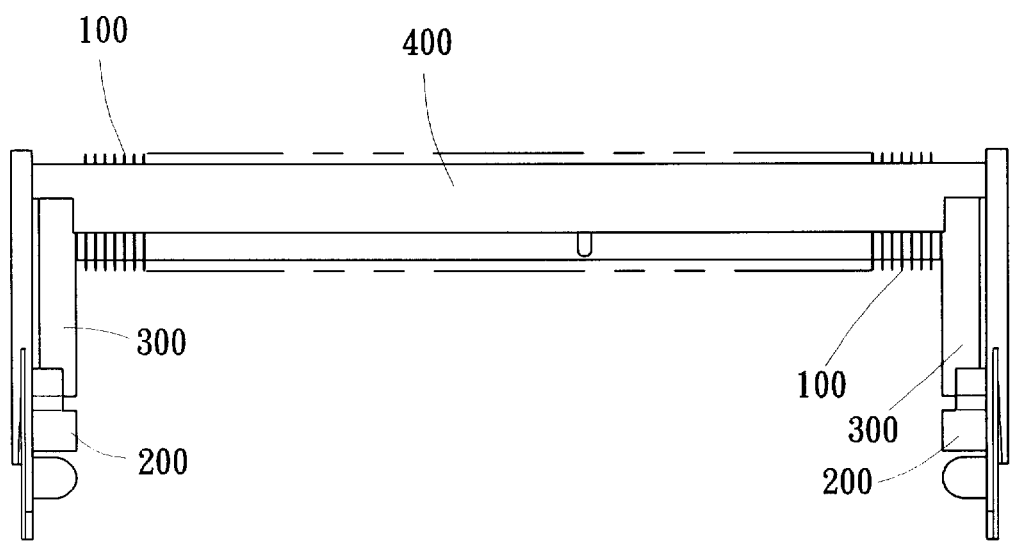
FIG. 13 shows a conventional connector.

Referring now to FIGS. 1 through 3, a part forming a portion of a leg of a connector or being a separate component to be connected to a connector is generally designated by reference numeral 10 and the associated solder tab is generally designated by reference numeral 50. In accordance with the present invention, the solder tab 50 is pivotally connected to the leg 10 whereby an end edge 52 of the tab 50 pivots with respect to the leg 10. This pivotal movement is self-adjustable due to the weight of the tab 50, i.e., its inertial movement. It is noted that the weight of the tab 50 is significantly larger than that of the individual solder terminal 100 (FIG. 13). In this way, it can always be ensured that the tab 50 will properly contact a circuit board (not shown) to enable a subsequent solder mounting operation to be adequately performed.

The leg 10 comprises a pair of extension walls 12 and a pivot 14 supported between the pair of extension walls 12. The pivot 14 pivotally supports the solder tab 50 between the pair of extension walls 12. To achieve a pivotable support, the solder tab 50 has a pair of lugs 52 and a slit 54 extending from one of the lugs 56 to the other lug. The slit 54 consists of two end sections 542 and an intermediate section 544 communicating with the two end sections 542. The two end sections 542 permit a forced entrance of the pivot 14 and the intermediate section 544 seatingly receives the pivot 14. In the embodiment shown in FIG. 1, the pivot 14 is integrally formed with the pair of extension walls 12, while in the embodiment shown in FIG. 3, the pivot 14 is separately provided between the pair of extension walls 12.

Figure 4:
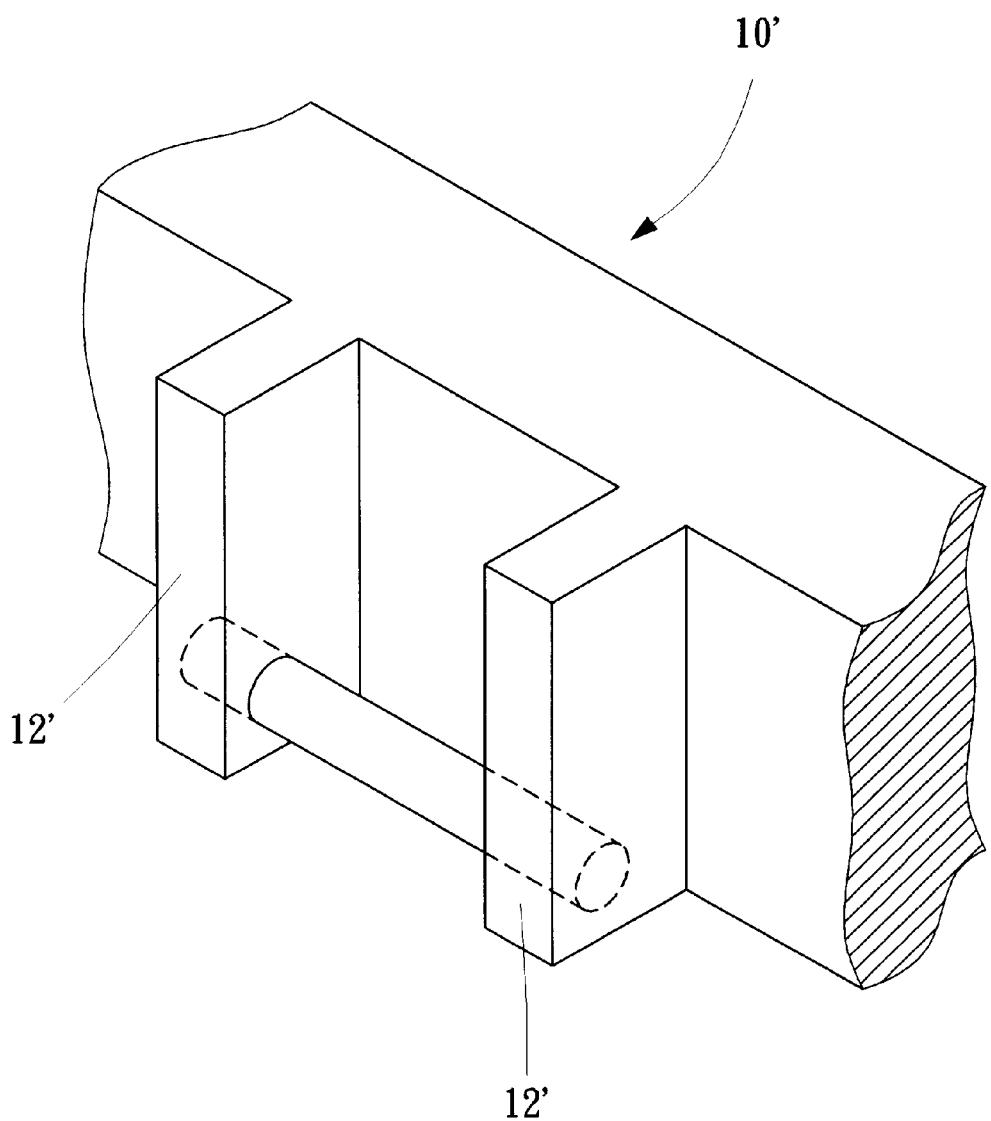
FIG. 4 is a perspective view showing a part of a connector in accordance with another embodiment of the present invention.

FIG. 4 shows a varied leg 10' where each extension wall 12' extends in a direction perpendicular to that of the extension wall 12. For example, if the extension wall 12 extends lengthwise from the leg 10, then the extension wall 12' may extend laterally from the leg 10. FIG. 13 shows the case where the solder tab 200 extends laterally from the leg 300.

Figure 5:
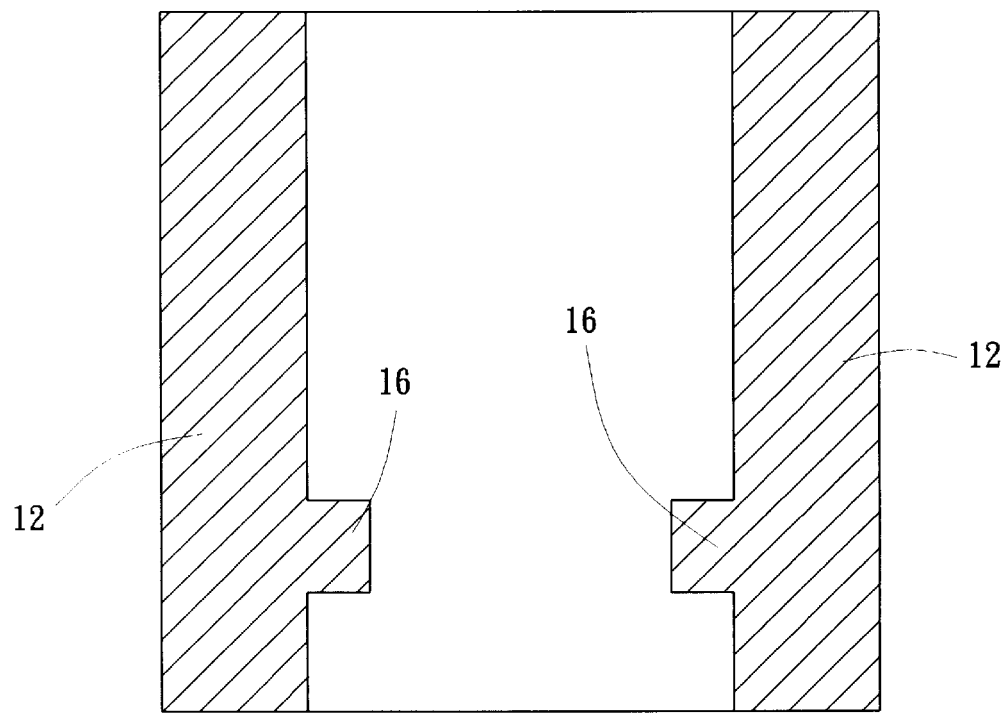
FIG. 5 is a cross-sectional view showing a part of a connector in accordance with a further embodiment of the present invention.
Figure 6:
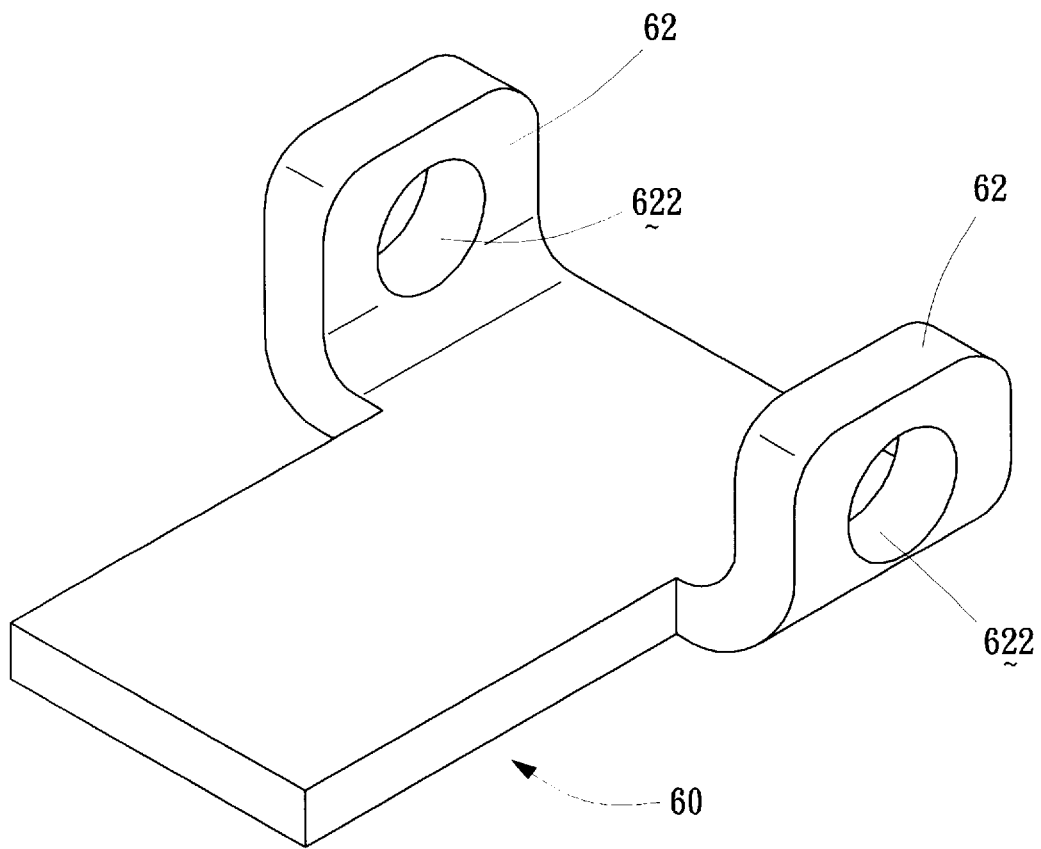
FIG. 6 is a perspective view showing a solder tab in accordance with another embodiment of the present invention.
Figure 7:
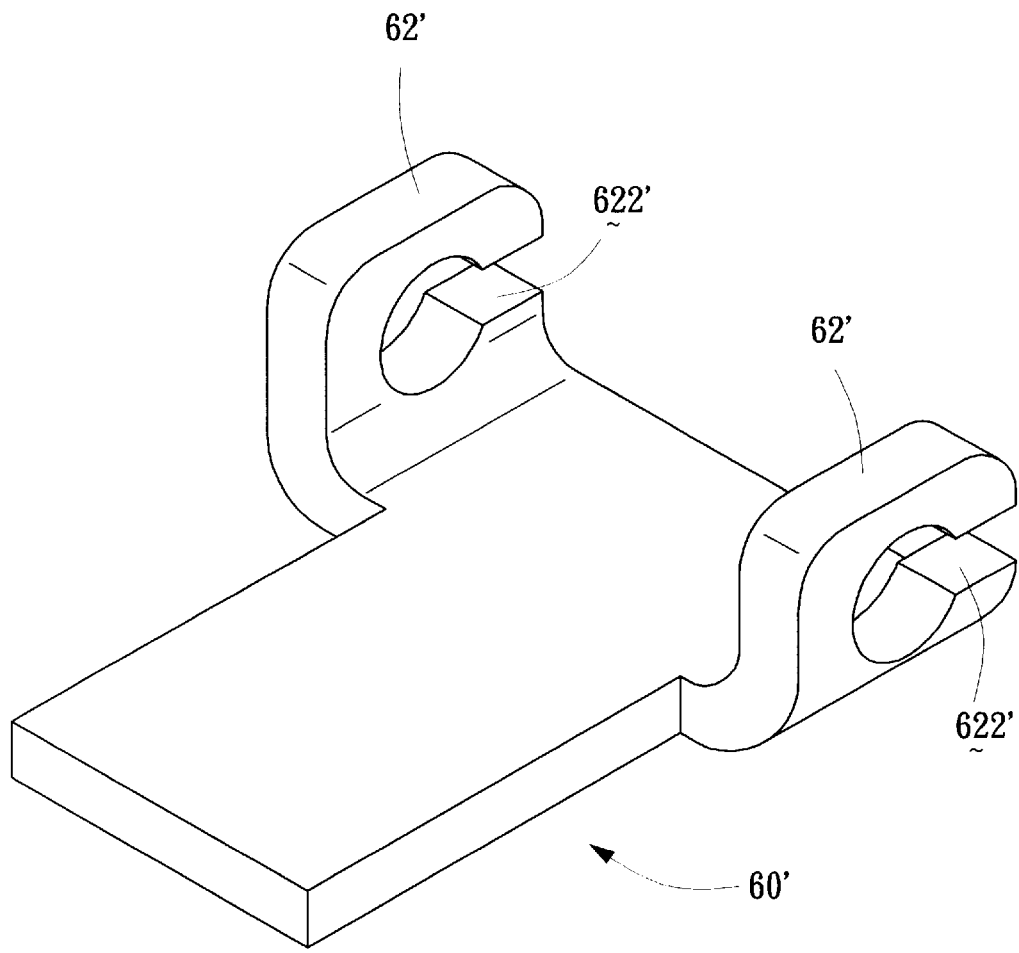
FIG. 7 is a perspective view showing a solder tab in accordance with a further embodiment of the present invention.

FIG. 5 shows that, instead of a pivot, a pair of protrusions 16 may extend toward each other from opposite extension walls 12. To accommodate this modification, as shown in FIG. 6, a solder tab 60 is provided with a pair of resilient lugs 62. Each resilient lug 62 has a hole 622 therein. Due to the resiliency of the lugs 62, the tab 60 can be mounted to a leg with each protrusion 16 received in a corresponding hole 622. Thus, the solder tab 60 can be pivotally connected to the pair of protrusions 16. FIG. 7 shows a modification to the solder tab for use with the pair of protrusions of FIG. 5. Unlike the tab 60 shown in FIG. 6, the solder tab 60' of FIG. 7 has a pair of lugs 62' which are each formed with a respective slot 622' for receiving a corresponding protrusion 16.

Figure 8:
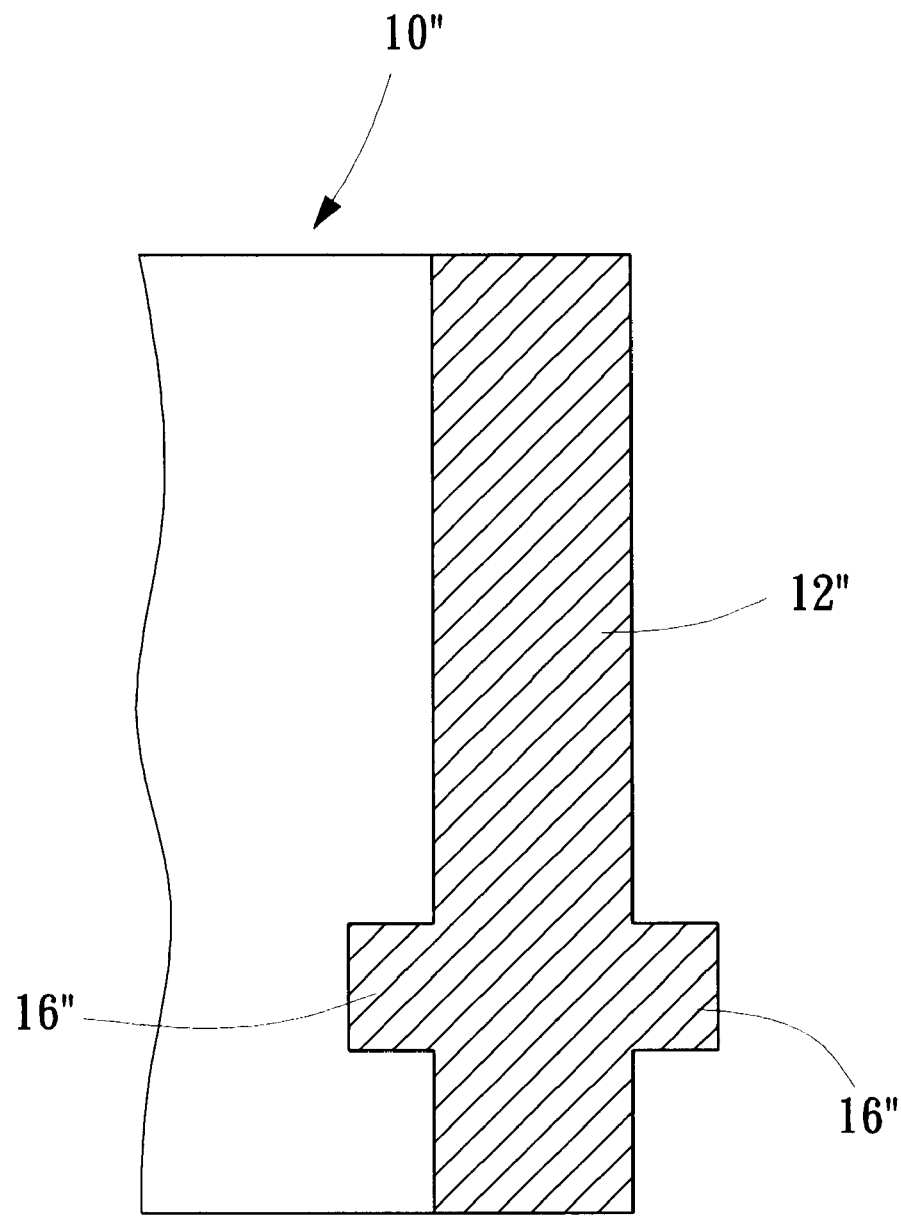
FIG. 8 is a cross-sectional view showing part of a connector in accordance with still a further embodiment of the present invention.
Figure 9:
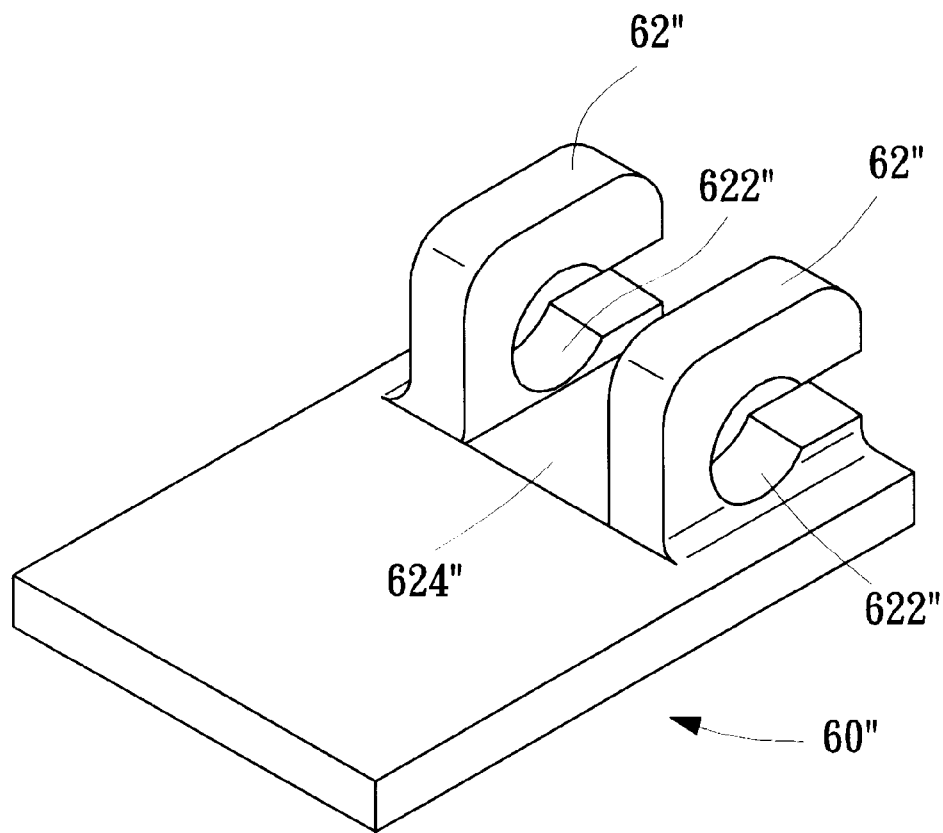
FIG. 9 is a perspective view showing a solder tab in accordance with yet a further embodiment of the present invention.

FIGS. 8 and 9 concern a leg 10" having a single extension wall 12" and a solder tab 60". The extension wall 12" has a pair of protrusions 16" laterally extending from opposite sides thereof. The tab 60" has a pair of lugs 62" and a recess 624" separating the pair of lugs 62". Each lug 62" has a hole 622" for receiving a corresponding protrusion 16". The protrusions 16" therefore pivotally support the tab 60" with respect to the extension wall 12". The resilient property of a lug thus may be suitably used to eliminate the need of forming a hole 622" on the lug 62".

Figure 10:
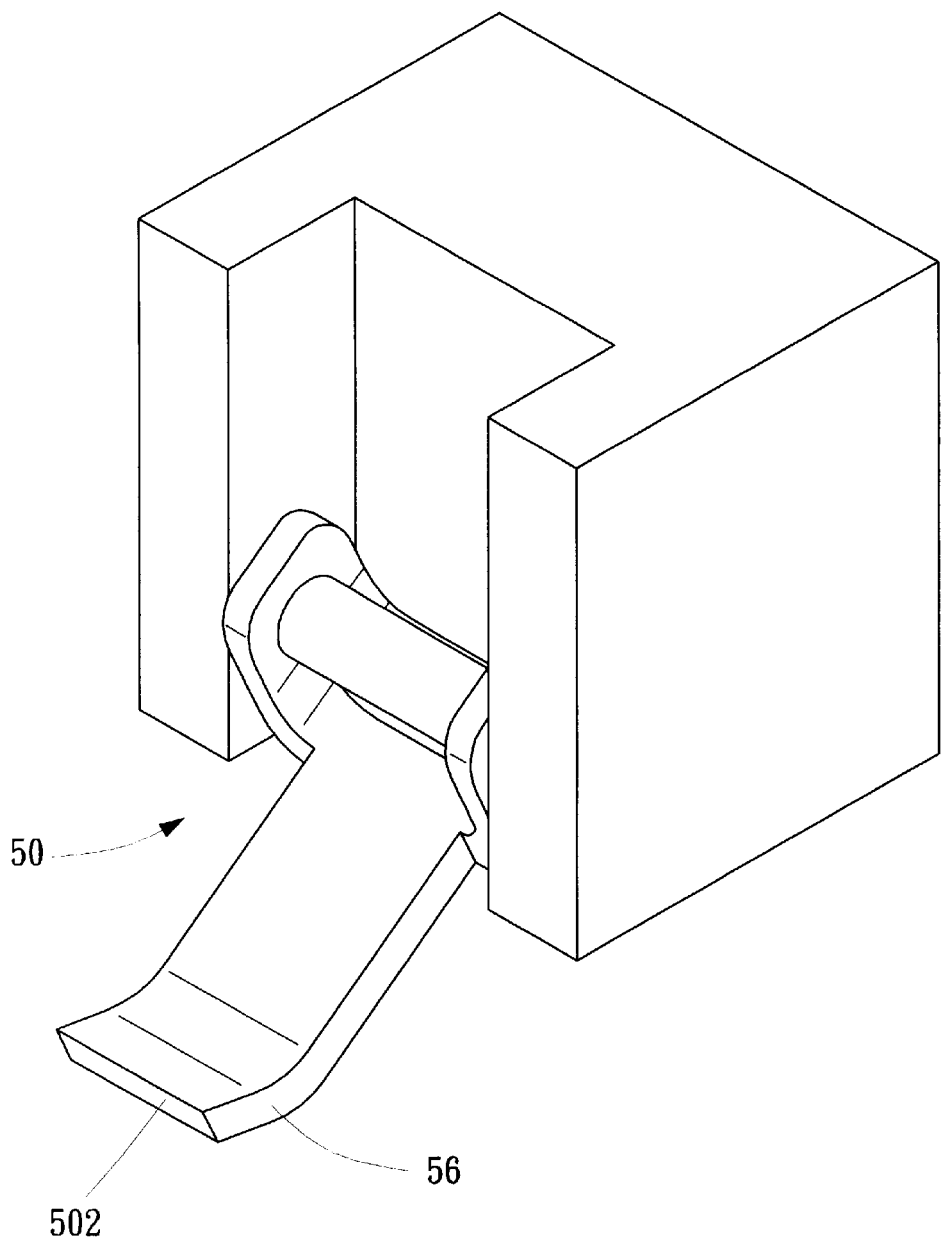
FIG. 10 is a schematic perspective view showing a part of a connector which incorporates a solder tab in accordance with yet another embodiment of the present invention.
Figure 11:
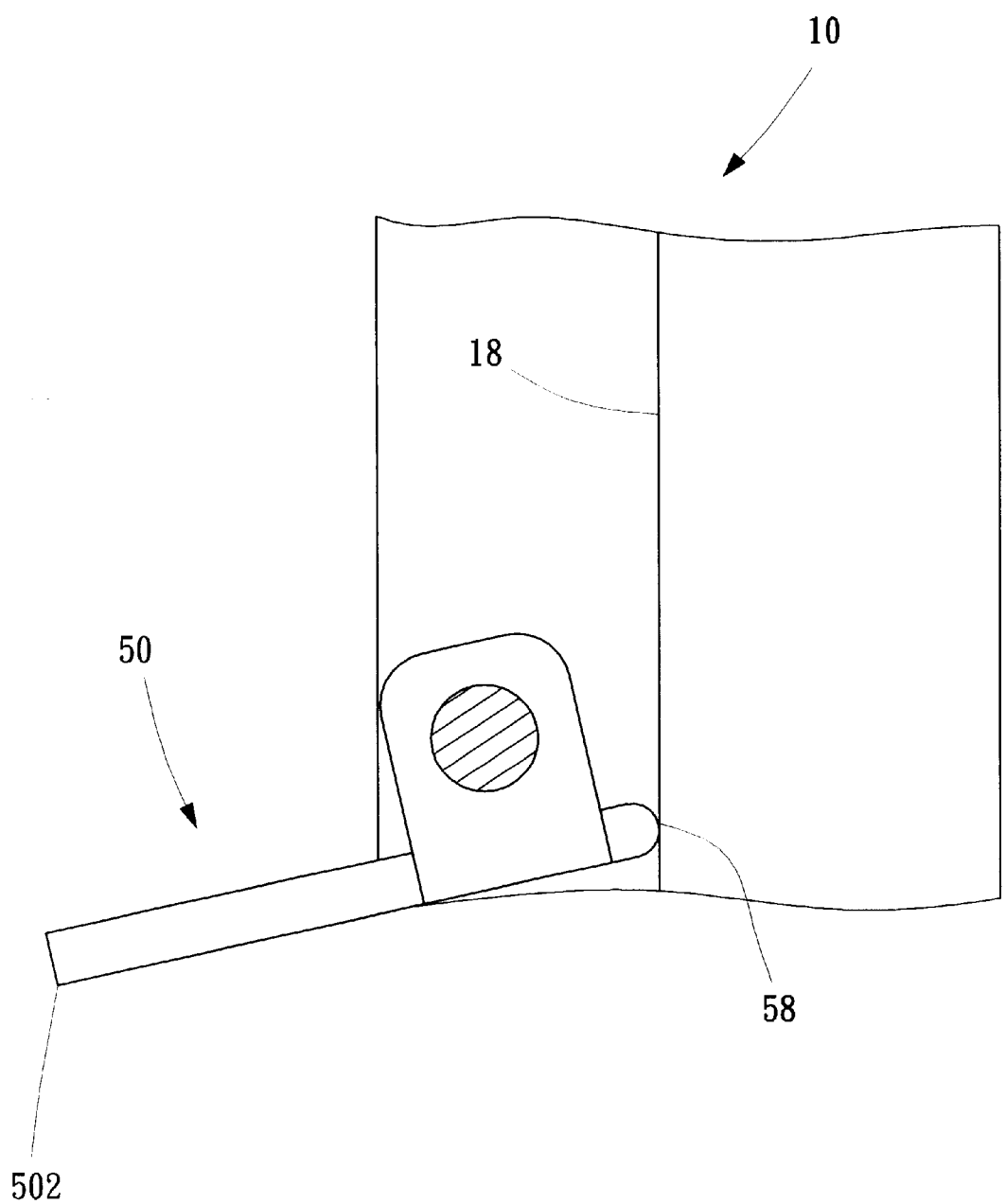
FIG. 11 is a cross-sectional view showing a part of a connector which incorporates a solder tab in accordance with yet still another embodiment of the present invention.

As shown in FIG. 10, in order to increase the soldering area between a solder tab and a circuit board, an end portion 56 of the solder tab 50 containing the end edge 52 is curved. Moreover, a stop 58 is formed at an end portion of each solder tab opposite the end edge 52 and the leg 10 has a wall face 18 adjacent to the stop 58 for limiting the pivotal movement of the solder tab 50 relative to the leg 10. In this case, when a connector constructed in accordance with the present invention is mounted onto a circuit board, the end edge 52 or the end portion 56 containing the end edge 52 will contact the circuit board first to clear the contact between the stop 58 and the wall face 18. This is beneficial to the handling of solder tabs or during preparation for a soldering operation.

Figure 12:
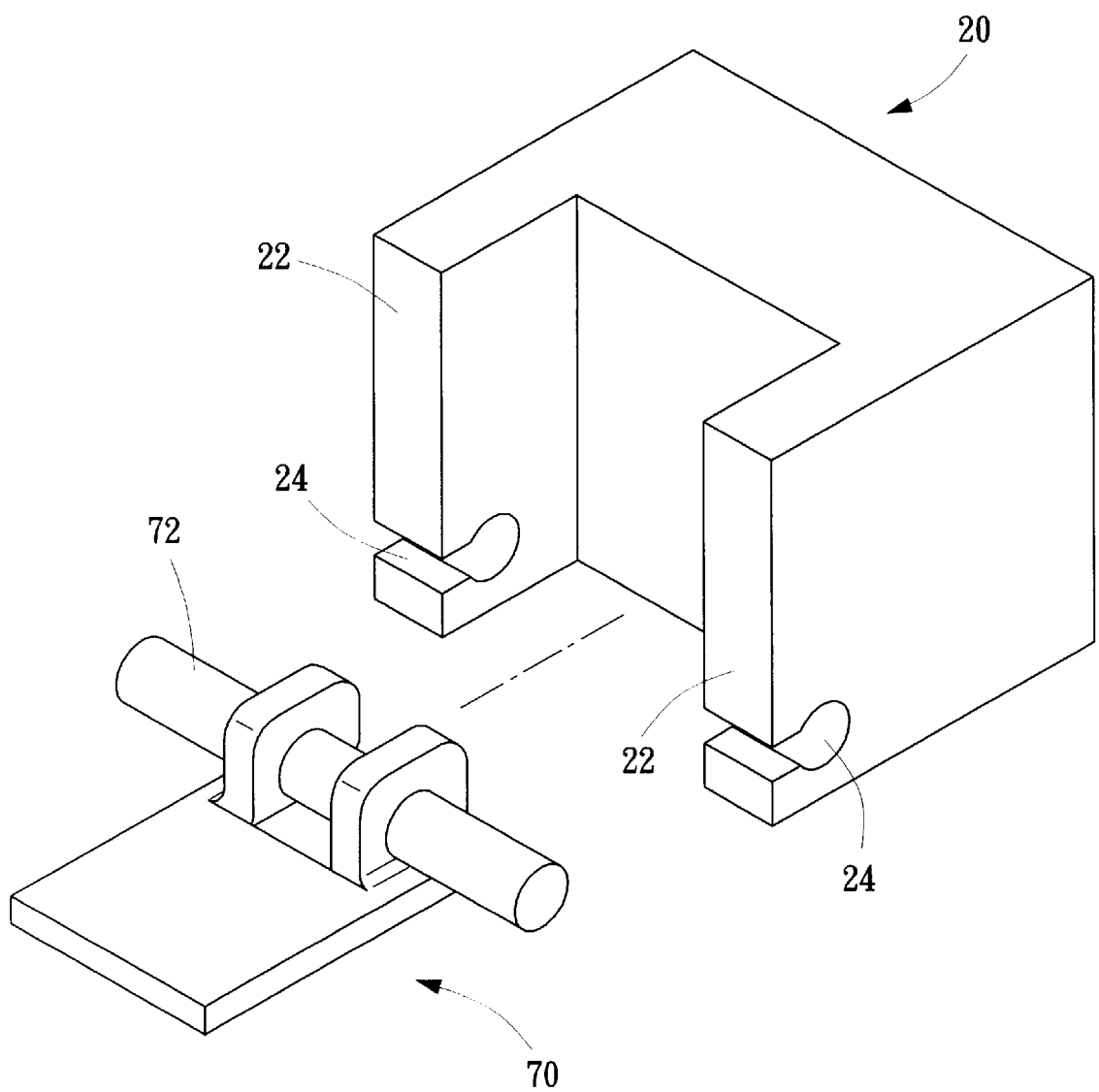
FIG. 12 is a schematic perspective view showing part of a connector and a mating solder tab in accordance with another embodiment of the present invention.

According to another feature of the invention, it is possible to eliminate the need for providing a pivot or protrusions on the extension wall. This can be achieved by moving the pivot from the leg to the solder tab. As shown in FIG. 12, the solder tab 70 comprises a pivot 72 and the leg 20 comprises a pair of extension walls 22 and a respective slot 24 formed on each extension wall.22. The slot 24 has an entrance of a reduced dimension and a seat of a dimension only slightly larger than a diameter of the pivot 72. The pivot 72 may enter the slot 24 by the elastic deformation property of the extension wall 22 and be seated therein.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, the extension wall may be made from plastic material or from other materials if desired.

We claim:

1. A connector comprising:
    an insulative body having a pair of legs;
    a plurality of electrical contacts received in the insulative body, each electrical contact having a solder terminal lying in a common plane; and
    a pair of solder tabs each pivotally connected with a corresponding leg, each solder tab having an end edge adjustably pivotable to substantially lie in the common plane.

2. The connector as claimed in claim 1, wherein each leg comprises a pair of extension walls and means for pivotally supporting each solder tab between the pair of extension walls.

3. The connector as claimed in claim 2, wherein:
    the means for pivotally supporting comprises a pivot supported between the pair of extension walls; and
    each solder tab is pivotally connected to the pivot.

4. The connector as claimed in claim 3, wherein:
    each solder tab has a pair of lugs and a slit extending from one of the lugs to the other lug; and
    the pivot extends through the slit.

5. The connector as claimed in claim 4, wherein the slit comprises two end sections and an intermediate section communicating with the two end sections, the two end sections permitting entrance of the pivot and the intermediate section seatingly receiving the pivot.

6. The connector as claimed in claim 3, wherein the pivot is integrally formed with the extension walls or separately provided on the extension walls.

7. The connector as claimed in claim 2, wherein:

the means for pivotally supporting comprises a pair of protrusions each extending from one of the pair of extension walls toward each other; and each solder tab is pivotally connected to the pair of protrusions.

8. The connector as claimed in claim 7, wherein each solder tab has a pair of resilient lugs, each resilient lug having a hole for receiving a corresponding protrusion.

9. The connector as claimed in claim 7, wherein each solder tab has a pair of lugs, each lug having a slot for receiving a corresponding protrusion.

10. The connector as claimed in claim 1, wherein each leg comprises one extension wall and means for pivotally supporting each solder tab on the extension wall.

11. The connector as claimed in claim 10, wherein:

the means for pivotally supporting comprises a pair of protrusions laterally extending from opposite sides of the extension wall; and each solder tab is pivotally connected to the pair of protrusions.

12. The connector as claimed in claim 11, wherein each solder tab has a pair of lugs and a recess separating the pair of lugs, each lug having a hole for receiving a corresponding protrusion.

13. The connector as claimed in claim 1, wherein an end portion of the solder tab containing the end edge is curved.

14. The connector as claimed in claim 1, wherein:

an end portion of each solder tab opposite the end edge comprises a stop; and each leg comprises a wall face adjacent to the stop for limiting a pivotal movement of the solder tab relative to the leg.

15. The connector as claimed in claim 1, wherein:

each solder tab comprises a pivot; and each leg comprises means for pivotally receiving the pivot.

16. The connector as claimed in claim 15, wherein the means for pivotally receiving comprises:

a pair of extension walls; and a slot formed on each extension wall.

17. A connector comprising:

an insulative body having a pair of legs;

a plurality of electrical contacts received in the insulative body, each electrical contact having a solder terminal lying in a common plane; and a pair of solder tabs each pivotally connected to a corresponding leg, each solder tab having an end edge pivotable independent of the common plane.

18. The connector as claimed in claim 17, wherein an end portion of the solder tab containing the end edge is curved.

19. The connector as claimed in claim 17, wherein:

an end portion of each solder tab opposite the end edge comprises a stop; and each leg comprises a wall face adjacent to the stop for limiting a pivotal movement of the solder tab relative to the leg.

20. A surface mount type connector comprising:

an insulative body' a plurality of contacts received within said body and having solder terminals respectively lying on a common plane; and at least a solder tab which is much larger than each of said solder terminals of the contacts but is substantially smaller than a sum of all said solder terminals of the contacts; wherein said solder tab is pivotably self-adjustable to comply with the solder terminals for lying on the same common plane.

\* \* \* \* \*